US012765008B2

(12) United States Patent
Wang

(10) Patent No.: US 12,765,008 B2
(45) Date of Patent: Oct. 13, 2026

(54) SUPER-JUNCTION DEVICE AND MANUFACTURING METHOD THEREOF

(71) Applicant: Hangzhou Silicon-Magic Semiconductor Technology Co., Ltd., Hangzhou City (CN)

(72) Inventor: Jiakun Wang, Hangzhou City (CN)

(73) Assignee: Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 963 days.

(21) Appl. No.: 17/946,100

(22) Filed: Sep. 16, 2022

(65) Prior Publication Data

US 2023/0093383 A1 Mar. 23, 2023

(30) Foreign Application Priority Data

Sep. 18, 2021 (CN) ......................... 202111098970.6

(51) Int. Cl.
*H10D 62/10* (2025.01)
*H10D 30/01* (2025.01)
(Continued)

(52) U.S. Cl.
CPC ....... *H10D 62/111* (2025.01); *H10D 30/0291* (2025.01); *H10D 30/66* (2025.01);
(Continued)

(58) Field of Classification Search
CPC .. H10D 30/66; H10D 62/111; H10D 30/0291; H10D 62/393; H10D 30/0297;
(Continued)

(56) References Cited

U.S. PATENT DOCUMENTS

2010/0048004 A1 2/2010 Hashimoto et al.
2010/0187599 A1* 7/2010 Sasaki .................. H10D 62/058 257/329
(Continued)

FOREIGN PATENT DOCUMENTS

CN 104916686 A * 9/2015 ........... H10D 30/668
CN 206558510 U 10/2017
(Continued)

OTHER PUBLICATIONS

CN 104916686 A Original Document (Year: 2014).*
(Continued)

*Primary Examiner* — Jessica S Manno
*Assistant Examiner* — Victor Joseph Lasasso
(74) *Attorney, Agent, or Firm* — Westman, Champlin & Koehler, P.A.

(57) ABSTRACT

The present disclosure relates to a super-junction device and a manufacturing method thereof. In the manufacturing method, a first plurality of semiconductor pillars are formed in an epitaxial layer and a sacrificial stack is formed above the epitaxial layer. The sacrificial stack is used as a hard mask both for a body region and for a source region, and has a sidewall which controls a channel length of the super-junction device to reduce process fluctuation in different batches and improve reliability of the super-junction device.

20 Claims, 7 Drawing Sheets

100

(51) Int. Cl.

| | |
|---|---|
| ***H10D 30/66*** | (2025.01) |
| ***H10D 62/17*** | (2025.01) |
| ***H10P 14/20*** | (2026.01) |
| ***H10P 14/24*** | (2026.01) |
| ***H10P 30/20*** | (2026.01) |
| ***H10P 30/22*** | (2026.01) |

(52) U.S. Cl.
CPC ........... *H10D 62/393* (2025.01); *H10P 14/24* (2026.01); *H10P 14/3411* (2026.01); *H10P 30/204* (2026.01); *H10P 30/21* (2026.01); *H10P 30/22* (2026.01)

(58) Field of Classification Search
CPC .. H10D 62/124; H10D 30/668; H10D 30/021; H10D 30/665; H10D 62/058; H10D 64/256; H10D 62/157; H01L 21/26586; H01L 21/266; H01L 21/26513; H10P 30/21; H10P 30/204
See application file for complete search history.

(56) References Cited

U.S. PATENT DOCUMENTS

| | | | | |
|---|---|---|---|---|
| 2011/0057255 | A1 | 3/2011 | Sasaki | |
| 2012/0164810 | A1* | 6/2012 | Ooi | H10D 30/66 257/E21.409 |
| 2013/0189819 | A1* | 7/2013 | Eguchi | H10D 30/0297 438/270 |

FOREIGN PATENT DOCUMENTS

| | | | |
|---|---|---|---|
| CN | 108538918 | A | 9/2018 |
| CN | 107195682 | B | 6/2020 |
| JP | 2002299620 | A | 10/2002 |

OTHER PUBLICATIONS

CN 104916686 A Translation (Year: 2014).*
First Office Action, including Search Report, for Chinese Patent Application No. 202111098970.6, dated Jun. 29, 2023, 17 pages.

* cited by examiner

SUPER-JUNCTION DEVICE AND MANUFACTURING METHOD THEREOF

CROSS-REFERENCE TO RELATED APPLICATION

The present application claims the priority to Chinese Patent Application No. 202111098970.6, filed on Sep. 18, 2021, entitled "SUPER-JUNCTION DEVICE AND MANUFACTURING METHOD THEREOF", and published as CN113782445A on Dec. 10, 2021, the disclosures of which are incorporated herein by reference in their entireties.

TECHNICAL FIELD

The present disclosure relates to semiconductor technology, and more particularly, to a super-junction device and a manufacturing method thereof.

BACKGROUND

A vertical double-diffused metal-oxide semiconductor field effect transistor (VDMOS) has a body region in an epitaxial layer. The body region provides not only a channel of a field effect transistor, but also a base region of a bipolar transistor. Therefore, the VDMOS has characteristics of both the field effect transistor and the bipolar transistor, such as a high input impedance, a fast switching speed and a highly-linear transconductance. The VDMOS is an ideal power device for both switching and linear applications.

While the VDMOS is widely used in integrated circuits, the VDMOS needs to have a lower specific on-resistance without losing a withstand voltage. A well-known approach is to form a super-junction structure in an epitaxial layer. The super-junction structure includes a first plurality of semiconductor pillars and a second plurality of semiconductor pillars, which are of opposite doping types and arranged in an alternate manner. For an N-type VDMOS, the second plurality of semiconductor pillar, which are of the P type, have an auxiliary depletion effect on the first plurality of semiconductor pillars, which are of the N type, and on an N-type epitaxial region. For a P-type VDMOS, the second plurality of semiconductor pillar, which are of the N type, have an auxiliary depletion effect on the first plurality of semiconductor pillars, which are of the P type, and on a P-type epitaxial region. Thus, the epitaxial region may have a higher doping concentration for the same withstand voltage state, thereby reducing the specific on-resistance of the VDMOS. Moreover, PN junctions in the super-junction structure have an effect of adjusting electric field distribution to be uniform one, thus improving the withstand voltage of the VDMOS.

In a conventional manufacturing method of the super-junction device, a body region and a source region are formed in two different ion implantation steps, and a gate stack is formed above the body region and across adjacent edges of the body region and the source regions. Therefore, a channel length of the super-junction device corresponds to a distance between the adjacent edges of the body region and the source region. However, due to alignment errors, the channel length of the super-junction devices varies in different batches, which leads to variations of switching performance of the power device and poor reliability of the power device.

SUMMARY

In view of the above problems, it is an object of the present disclosure to provide a super-junction device and a manufacturing method thereof, in which a channel length is defined by a sidewall of a sacrificial stack so as to reduce process fluctuation in different batches and improve reliability of the super-junction device.

According to one aspect of the present disclosure, there is provided a method for manufacturing a super-junction device, comprising: forming an epitaxial layer above a semiconductor substrate; forming a first plurality of semiconductor pillars in the epitaxial layer; forming a sacrificial stack above the epitaxial layer; forming a body region in the epitaxial layer with the sacrificial stack as a first hard mask, the body region having a first edge aligned with the first hard mask; forming a sidewall on a side surface of the sacrificial stack; forming a source region in the body region with the sacrificial stack and the sidewall as a second hard mask, the source region having a first edge aligned with the second hard mask; removing the sacrificial stack; and forming a gate stack on the epitaxial layer, wherein the gate stack extends across the first edge of the body region and the first edge of the source region such that a channel length of the super-junction device corresponds to a sidewall thickness of the sacrificial stack.

According to another aspect of the present disclosure, there is provided a super-junction device comprising: an epitaxial layer above a semiconductor substrate; a first plurality of semiconductor pillars in the epitaxial layer; a body region in the epitaxial layer, at least one of the first plurality of semiconductor pillars extending below the body region; a source region in the body region; and a gate stack above the epitaxial layer, wherein the gate stack extends across a first edge of the body region and a first edge of the source region such that a channel length of the super-junction device corresponds to a sidewall thickness of a sacrificial stack.

In the manufacturing method, a body region is formed in a self-aligned manner using a sacrificial stack as a hard mask, and a source region is formed in a self-aligned manner using the sacrificial stack and its sidewall as a hard mask. Thus, the sidewall thickness defines a distance between two adjacent edges of the body region and the source region. In the super-junction device, a gate conductor is formed above a body region and across two adjacent edges of the body region and the source region. The sidewall thickness defines a channel length of the super-junction device. The sidewall thickness may be controlled to be a predetermined value in different batches. Thus, the channel length of the super-junction device may has a predetermined value, even in a case the super-junction device has a planar gate, which reduces process fluctuation in different batches and improves reliability of the super-junction device.

In the super-junction device, a super-junction structure is formed in an epitaxial layer. The super-junction structure includes a first plurality of semiconductor pillars and a second plurality of semiconductor pillars, which are of opposite doping types and arranged in an alternate manner. The first plurality of semiconductor pillars have an auxiliary depletion effect on the second plurality of semiconductor pillars. Thus, the epitaxial region may have a higher doping concentration for the same withstand voltage state, thereby reducing the specific on-resistance of the super-junction device. Moreover, PN junctions in the super-junction structure have an effect of adjusting electric field distribution to be uniform, thus improving the withstand voltage of the super-junction device.

BRIEF DESCRIPTION OF THE DRAWINGS

The above and other objects, features and advantages of the present disclosure will become more apparent from the following description of embodiments of The present disclosure with reference to the accompanying drawings, in which.

DESCRIPTION OF EMBODIMENTS

Figure 1A:
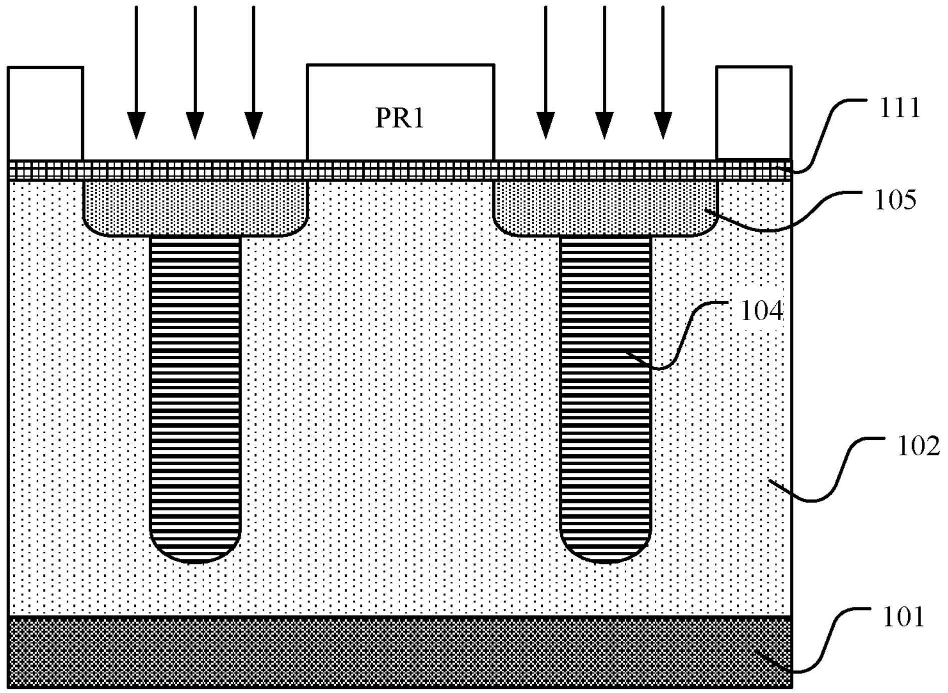
FIGS. 1*a* and 1*b* show respectively cross-sectional views in some steps of a manufacturing method of a super-junction device.

Various embodiments of the present disclosure will be described in more detail below with reference to the accompanying drawings. Throughout the various figures, like elements are denoted by the same or similar reference numerals. For the sake of clarity, various parts in the drawings are not drawn to scale. In addition, some well-known parts may not be shown. For the sake of simplicity, the semiconductor structure after several steps may be described in one diagram.

In a case that one layer or one region is referred to as being located "on" or "above" another layer or another region when a structure of a device is described, it means the one layer or the one region is located above another layer or another region, with or without additional layers or additional regions therebetween. Moreover, in a case that the device is turned upside down, the one layer or the one region will be "under" or "below" another layer or another region.

In a case that the one layer or the one region is located directly on another layer or another region, the expression will be "A is located directly on B", "A is located above and adjacent to B", "A is located above and contacts with B" or "A is located on an upper surface of B". In this disclosure, "A is located directly in B" means that A is located in B and A is directly adjacent to B, rather than A being located in a doped region of B. In addition, "A is located at an upper portion of B" means that A is located in B and has a top portion exposed from B.

Specific embodiments of the present disclosure are described in further detail below, with reference to the accompanying drawings and the corresponding embodiments.

Figure 1B:
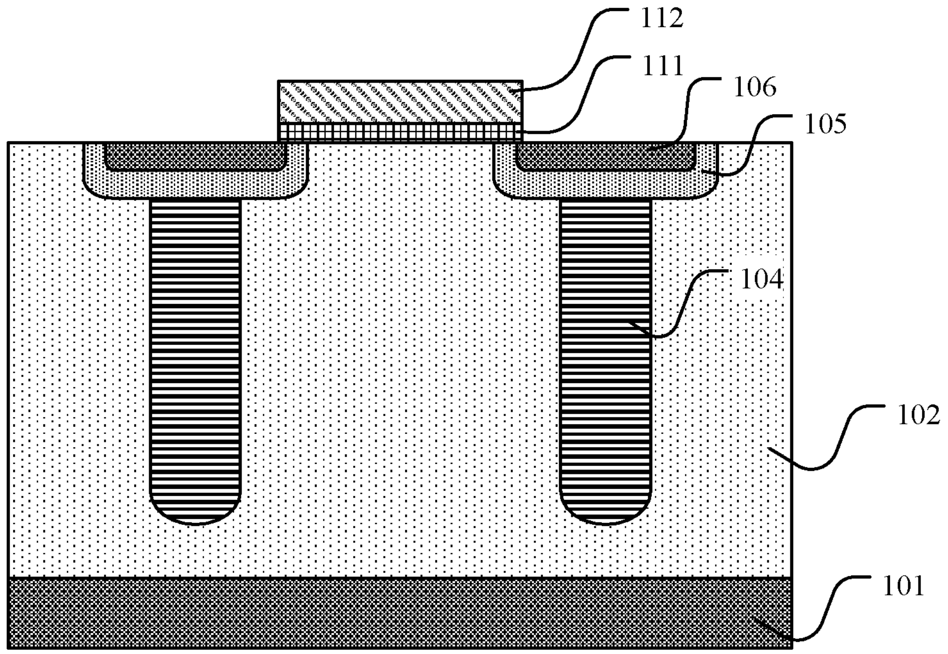

FIGS. 1*a* and 1*b* show respectively cross-sectional views in some steps of a manufacturing method of a super-junction device.

In the manufacturing method, an epitaxial layer 102 is formed on a semiconductor substrate 101 by an epitaxial growth process. A first plurality of semiconductor pillars 104 are formed in the epitaxial layer 102 by an ion implantation process. For example, the semiconductor substrate 101 and the epitaxial layer 102 are of an N type respectively, and the first plurality of semiconductor pillars 104 are of a P type. The first plurality of semiconductor pillars 104 extend from the surface of the epitaxial layer 102 to a predetermined depth by controlling process parameters of the ion implantation.

As shown in FIG. 1*a*, a gate dielectric 111 is formed on the surface of the epitaxial layer 102 by a deposition process or a thermal oxidation process. For example, the gate dielectric 111 is a silicon oxide layer with a thickness of 10-50 nm. A photoresist PR1 is formed on the gate dielectric 111. The ion implantation process is performed through an opening of the photoresist PR1 so that ions are injected into the epitaxial layer 102 via the gate dielectric 111 to form a body region 105. For example, the body region 105 is of a P type. The body region 105 extends from the surface of the epitaxial layer 102 to a predetermined depth by controlling process parameters of the ion implantation. The body region 105 overlaps with a portion of the first plurality of semiconductor pillars 104 near the surface of the epitaxial layer 102. After forming the body region 105, the photoresist PR1 is removed for example by dissolution or ashing.

As shown in FIG. 1*b*, a gate conductor 112 is formed on the gate dielectric 111 by a deposition process. The gate conductor 112 and the gate dielectric 111 are etched using a photoresist as a mask to form a gate stack. The two sides of the gate stack are located above the edges of the two body regions 105, respectively. A source region 106 is formed in the body region 105 by ion implantation, by using the gate stack as a hard mask and a photoresist as an additional mask. Due to the gate stack as the hare mask, the final super-junction device has a channel length corresponding to a distance between adjacent edges of the body region 105 and the source region 106.

However, in the manufacturing method described above, a position of the gate stack may be affected by an alignment error of the lithography process because the alignment error always exists in different batches. The channel length of the super-junction devices varies in different batches, which may lead to variations of switching performance of the power device and poor reliability of the power device.

FIGS. 2*a* to 2*i* show respectively cross-sectional views in some steps of a manufacturing method of a super-junction device according to an embodiment of the present disclosure.

The manufacturing method starts with a semiconductor substrate 101.

Figure 2A:
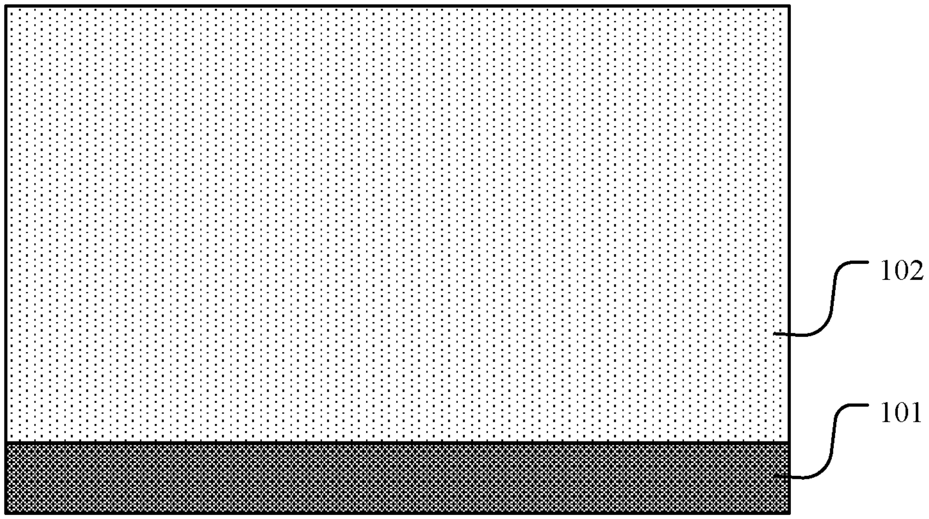
FIGS. 2*a* to 2*i* show respectively cross-sectional views in some steps of a manufacturing method of a super-junction device according to an embodiment of the present disclosure.

Then, an epitaxial layer 102 is formed on the semiconductor substrate 101 by an epitaxial growth process, as shown in FIG. 2*a*.

The epitaxial growth process is, for example, any one of gas phase epitaxy, liquid phase epitaxy, and molecular beam epitaxy. In a case that the semiconductor substrate 101 is a silicon substrate, a precursor gas and a reduction gas are introduced into a reaction chamber. Silicon atoms are formed by a reduction reaction and a single-crystalline silicon thin film is deposited on the silicon substrate, thereby forming an epitaxial layer of silicon. The epitaxial layer 102 has a thickness of, for example, 10-100 microns and a resistivity of 0.1-10 ohm_cm. For example, the semiconductor substrate 101 is a silicon substrate doped with an N-type dopant and the epitaxial layer 102 is an epitaxial layer of silicon doped with an N-type dopant, such as phosphorus or arsenic or antimony. Moreover, the semiconductor substrate 101 is heavily doped with respect to the epitaxial layer 102.

Figure 2B:
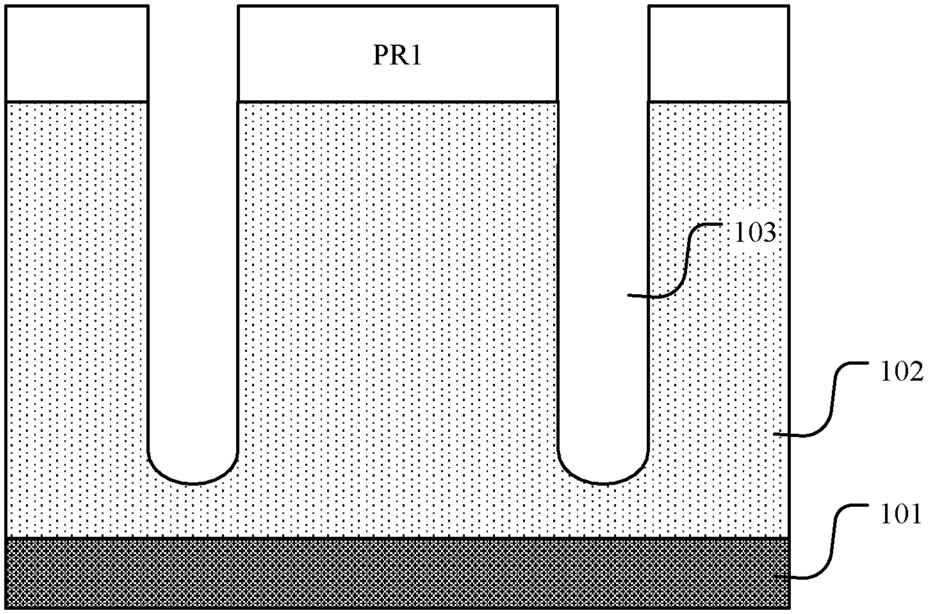

Then, a plurality of trenches 103 are formed in the epitaxial layer 102 by an etching process, as shown in FIG. 2*b*.

In this step, a photoresist PR1 is formed on the surface of the epitaxial layer 102. The photoresist PR1 is exposed and developed to form a pattern with openings. Exposed portions of the epitaxial layer 102 are removed through the openings of the photoresist PR1 to form a plurality of trenches 103. A depth of the plurality of trenches 103 can be controlled by controlling an etching time. The depth of the plurality of trenches 103 is 60-90% of a thickness of the epitaxial layer 102, for example 8-90 microns. After forming the plurality of trenches 103, the photoresist PR1 is removed for example by dissolution or ashing.

Figure 2C:
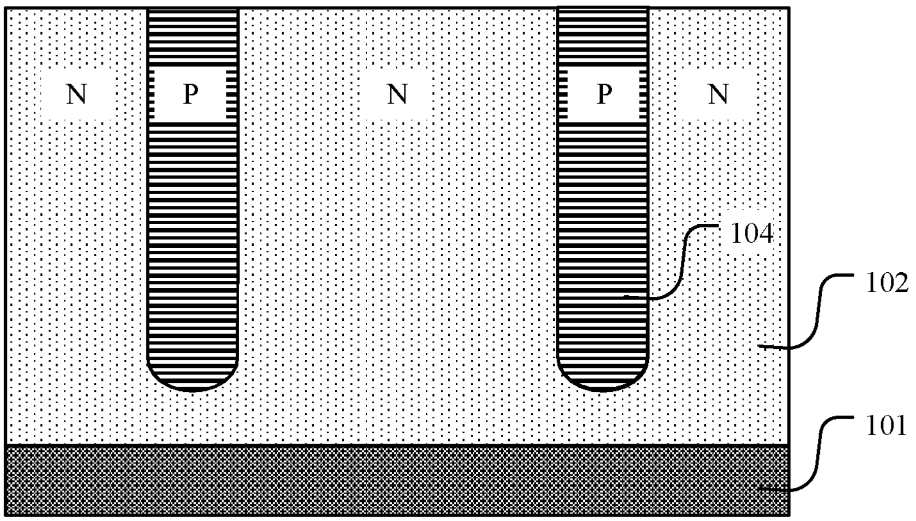

Then, a first plurality of semiconductor pillars 104 are epitaxially grown in the plurality of trenches 103 by an epitaxial growth process, as shown in FIG. 2*c*.

The epitaxial growth process in this step is similar to the epitaxial growth process for forming the epitaxial layer 102 described above. Each of the first plurality of semiconductor pillars 104 is an epitaxial layer of silicon doped with a P-type dopant, for example, boron or boron difluoride (BF2), with an implantation dose of 1e12-1e14/cm2 and an implantation energy of 10-200 kev. Thus, a first plurality of semiconductor pillars 104 are formed in the plurality of trenches 103, and a second plurality of semiconductor pillars are formed in the portions of the epitaxial layer 102 located between adjacent ones of the first plurality of semiconductor pillars 104. Each of the first and second plurality of semiconductor pillars has a depth corresponding to a depth of the plurality of trenches 103.

In the super-junction structure, the first plurality of semiconductor pillars and the second plurality of semiconductor pillars are alternately arranged and have opposite dopant types. Preferably, the first plurality of semiconductor pillars and the second plurality of semiconductor pillars have doping concentrations that are substantially identical ones along the plurality of trenches.

Figure 2D:
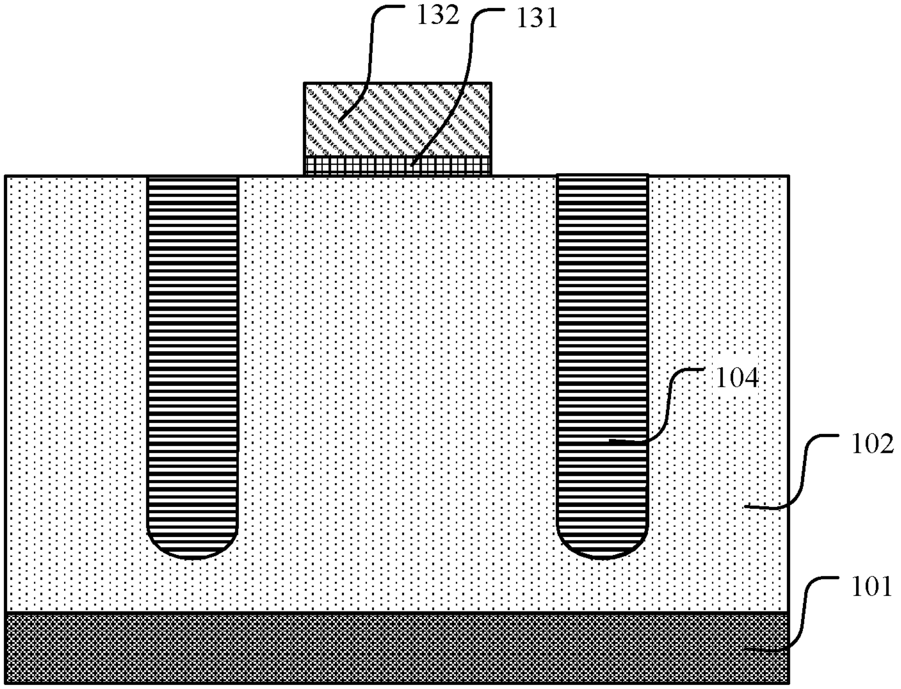

Then, a sacrificial stack is formed on the surface of the epitaxial layer 102 between adjacent ones of the first plurality of semiconductor pillars 104, as shown in FIG. 2*d*.

In this step, a sacrificial dielectric 131 is formed on the surface of the epitaxial layer 102 by a deposition process or a thermal oxidation process. For example, the sacrificial dielectric 131 is a silicon oxide layer with a thickness of 10-50 nm. A sacrificial conductor 132 is formed on the sacrificial dielectric 131 by a deposition process. For example, the sacrificial conductor 132 is a polysilicon layer with a thickness of 600 nm to 1000 nm.

The sacrificial conductor 132 and the sacrificial dielectric 131 are etched using a photoresist as a mask to form a sacrificial stack. In the etching step, the epitaxial layer 102 is used as a stop layer and portions of the sacrificial conductor 132 and the sacrificial dielectric 131 are selectively removed with respect to the epitaxial layer 102. After etching, the photoresist is removed, for example, by dissolution or ashing.

The etching step defines a shape and a location of the sacrificial stack. For example, the sacrificial stack has a shape of a strip. A length of the sacrificial stack corresponds to a length of the first plurality of semiconductor pillars in a transverse direction which is perpendicular to a paper surface, and a width of the sacrificial stack is less than a distance between adjacent ones of the first plurality of semiconductor pillars in a transverse direction which is in the paper surface.

Figure 2E:
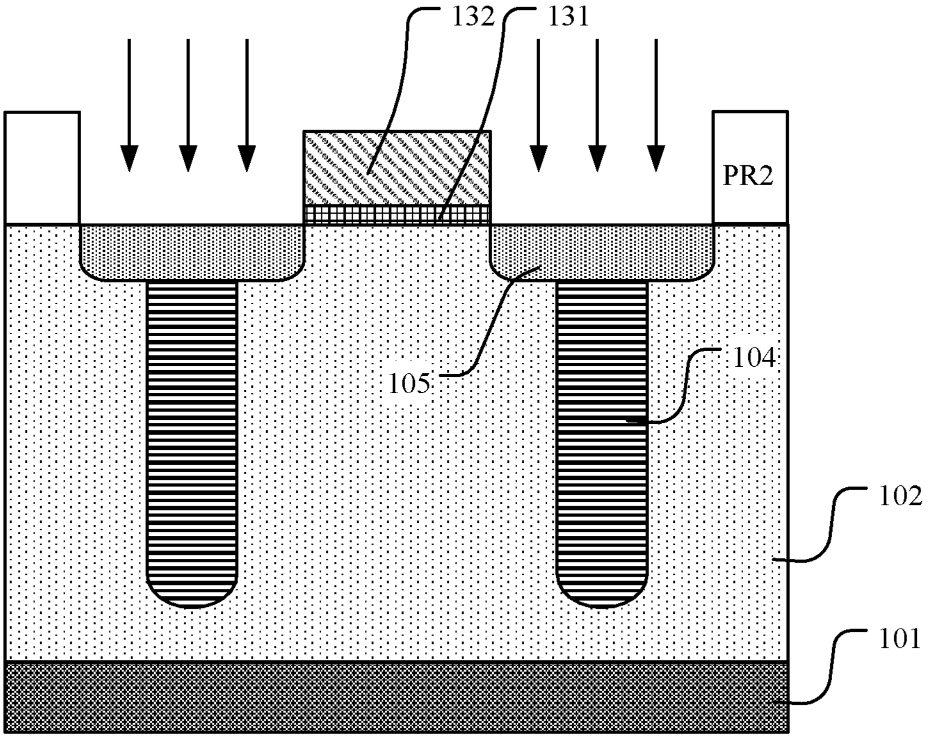

Then, ion implantation is performed using the sacrificial stack as a hard mask to form the body region 105, as shown in FIG. 2*e*.

In this step, the sacrificial stack may be used alone as a hard mask, or the sacrificial stack and the photoresist PR2 may be used together as a mask so that ions are implanted in the epitaxial layer 102 through an opening of the mask to form the body region 105. For example, the body region 105 is of a P type. The body region 105 extends from the surface of the epitaxial layer 102 to a predetermined depth by controlling process parameters of the ion implantation. The body region 105 overlaps with a portion of the first plurality of semiconductor pillars 104 near the surface of the epitaxial layer 102. After forming the body region 105, the photoresist PR2 is removed for example by dissolution or ashing.

Figure 2F:
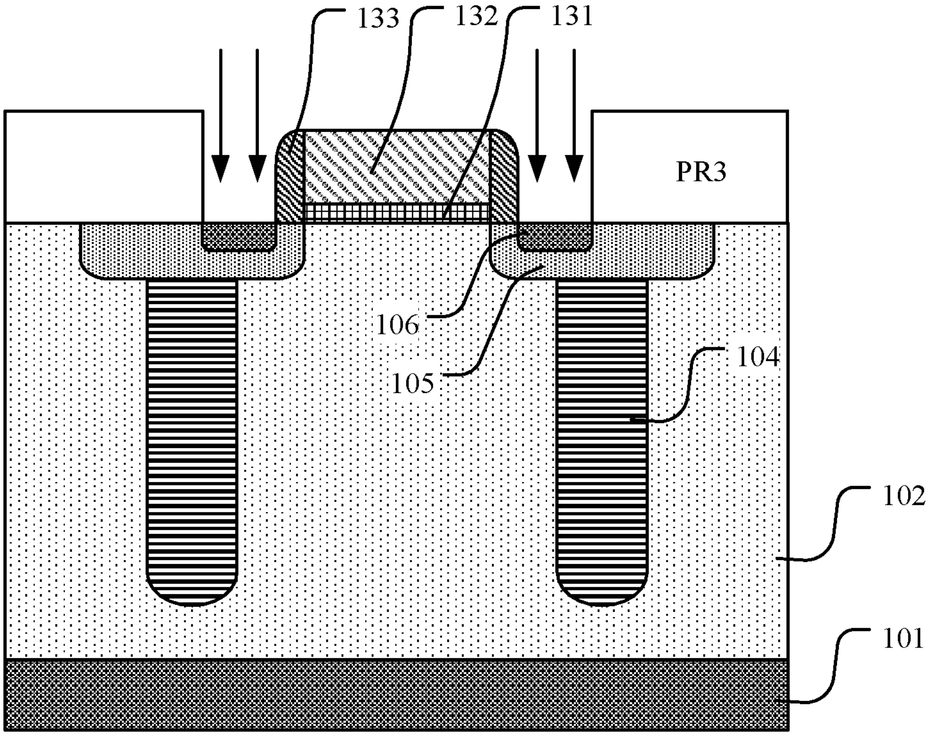

Then, ion implantation is performed using the sacrificial stack and its sidewalls as a hard mask to form a source region 106 in the body region 105, as shown in FIG. 2*f*.

In this step, a silicon oxide layer is deposited as a conformal layer by chemical vapor deposition, such as tetraethoxysilane (i.e. TEOS) as a precursor. Furthermore, portions of the silicon oxide layer on surfaces of the epitaxial layer 102 and the sacrificial conductor 132 are removed by anisotropic etching, while portions of the silicon oxide layer on the sidewalls of the sacrificial stack remain to form sidewalls.

With the sacrificial stack, its sidewalls and a photoresist PR3 together as a mask, ions are implanted in the epitaxial layer 102 through an opening of the mask to form the source region 106. For example, the source region 106 is of an N type. The source region 106 extends from a surface of the epitaxial layer 102 to a predetermined depth by controlling process parameters of the ion implantation. A depth of the source region 106 is less than a depth of the body region 105. After the source region 106 is formed, the photoresist PR3 is removed for example by dissolution or ashing.

In this ion implantation step, a hard mask defines a location of the source region 106. One edge of the body region 105 is aligned with an edge of the sacrificial stack, and the other edge of the source region 106 is aligned with an edge of the sidewall 133. Thus, a distance between adjacent edges of the body region 105 and the source region 106 near the sacrificial stack is approximately equal to a thickness of the sidewall 133.

Figure 2G:
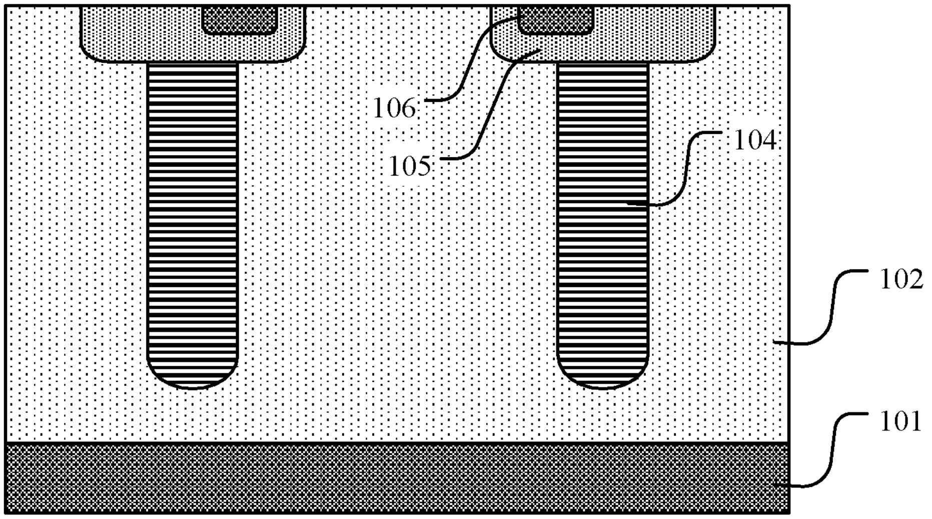

Then, the sacrificial stack and sidewall 133 are removed by etching, as shown in FIG. 2*g*.

In this etching step, the epitaxial layer 102 is used as a stop layer, and the sacrificial conductor 132, the sacrificial dielectric 131 and the sidewall 133 are selectively removed with respect to the epitaxial layer 102.

Figure 2H:
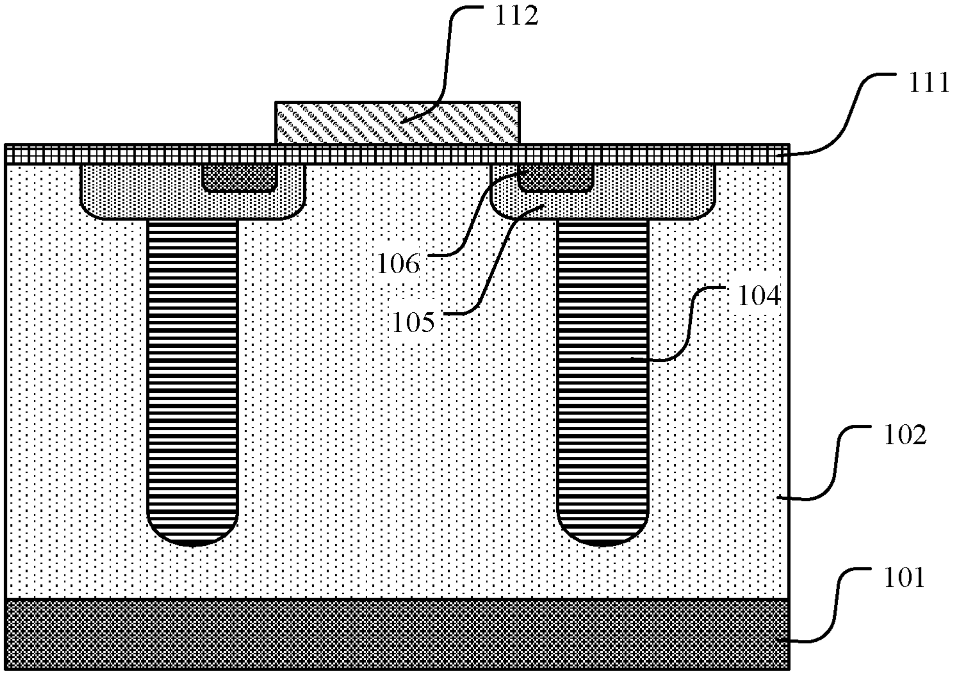

Then, a gate stack is formed on the surface of the epitaxial layer 102, between adjacent ones of the first semiconductor pillars 104, as shown by FIG. 2*h*.

In this step, a gate dielectric 111 is formed on the surface of the epitaxial layer 102 by a deposition process or a thermal oxidation process. For example, the gate dielectric 111 is a silicon oxide layer with a thickness of 10-50 nm. A gate conductor 112 is formed on the gate dielectric 111 by a deposition process. For example, the gate conductor 112 is a polysilicon layer with a thickness of 600 nm to 1000 nm.

The gate conductor 112 is etched using a photoresist as a mask to form a gate stack. In the etching step, the gate dielectric 111 is used as a stop layer and a portion of the gate conductor 112 is selectively removed with respect to the gate dielectric 111. After etching, the photoresist is removed, for example, by dissolution or ashing.

The etching step defines a shape and a location of the gate conductor 112. For example, the gate conductor 112 has a shape of a strip. A length of the gate conductor 112 corresponds to a length of the first plurality of semiconductor pillars in the transverse direction which is perpendicular to the paper surface, and a width of the gate conductor 112 is smaller than a distance between adjacent ones of the first plurality of semiconductor pillars in the transverse direction which is in the paper surface. Furthermore, The two sides of gate conductor 112 are disposed above the edges of the two body regions 105 and two source regions 106, respectively. Corresponding to a location of the gate conductor 112, the final super-junction device has channel length corresponding to a distance between adjacent edges of the body region 105 and the source region 106 near the gate conductor 112.

Figure 2I:
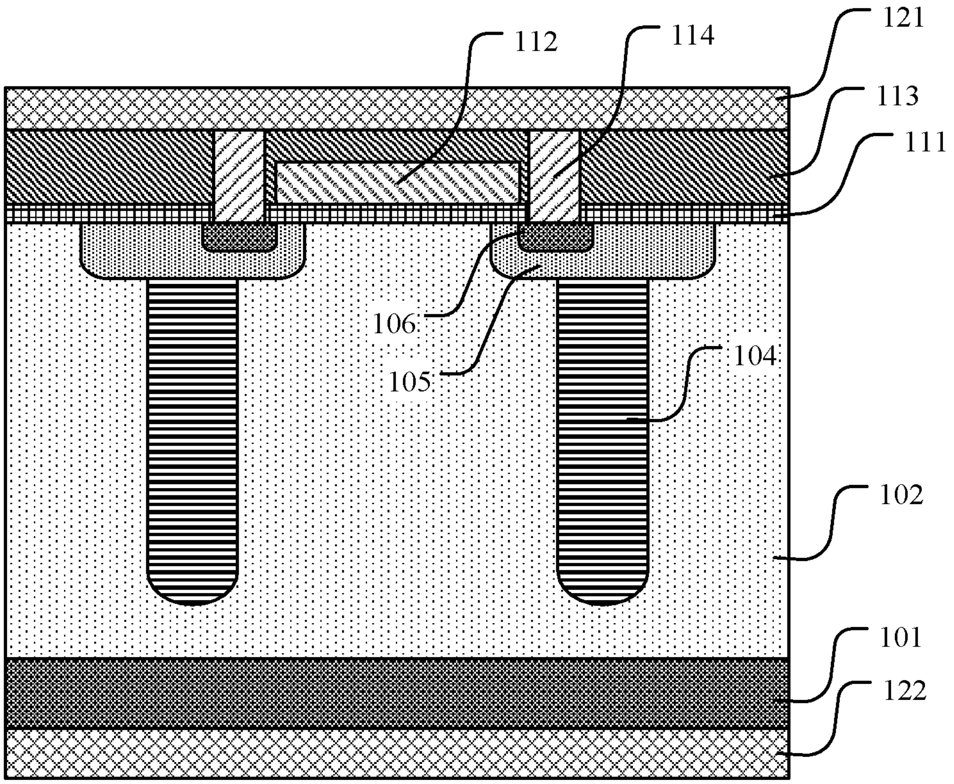

After forming the gate stack, a source electrode 121 is formed as being electrically coupled to the source region 106, and a drain electrode 122 is formed as being electrically coupled to the substrate 101, as shown by FIG. 2*i*.

In this step, an interlayer dielectric 113 is formed on a surface of the semiconductor structure by a known deposition process, such as electron beam evaporation (EBM), chemical vapor deposition (CVD), atomic layer deposition (ALD), sputtering, etc. The interlayer dielectric 113 covers the surfaces of the gate dielectric 111 and the gate conductor 112. Mechanical planarization (e.g. chemical mechanical polishing) is further performed to obtain a flat surface. The interlayer dielectric 113 may be made of silicon oxide, silicon nitride, or other well-known insulating material.

A photoresist is formed on a surface of the interlayer dielectric 113 and then the interlayer dielectric 113 is etched to form a via hole, which exposes a portion of the source region 106. The etching may be dry etching, such as ion milling etching, plasma etching, reactive ion etching, laser ablation, or may be selective wet etching by using an etchant solution. The interlayer dielectric 113 is etched through an opening in the photoresist, downwards until the surface of the source region 106 is reached. After etching, the photoresist is removed by dissolution or ashing in a solvent.

By the above-mentioned known deposition process, a conductive layer is formed to at least partially fill the via hole. The conductive layer also covers a surface of the interlayer dielectric 113. Mechanical planarization (e.g. chemical mechanical polishing) is performed with the interlayer dielectric 113 as a stop layer, and a portion of the conductive layer outside the via hole is removed. As a result, a remaining portion of the conductive layer that fills the via hole forms a conductive via 114. The bottom of the conductive via 114 contacts the source region 106. The conductive via 114 may be made of tungsten for example.

A source electrode 121 is formed on a surface of the interlayer dielectric 113 by the above-described known deposition process, and a drain electrode 122 is formed on the back surface of the semiconductor substrate 101 (i.e. the surface opposite to the epitaxial layer 102). The source electrode 121 is in contact with the top of the conductive via 114 and is electrically coupled to the source 106 through the conductive via 114. The drain electrode 122 is in direct contact with the semiconductor substrate 101. Preferably, a surface of the semiconductor substrate 101 is thinned to reduce an on-resistance of the super-junction device.

In the manufacturing method according to the above embodiment, a body region is formed in a self-aligned manner using a sacrificial stack as a hard mask, and a source region is formed in a self-aligned manner using a sacrificial stack and a sidewall as a hard mask. Accordingly, a distance between adjacent edges of the body region and the source region corresponds to a sidewall thickness. In the super-junction device, a gate conductor extends above the body region across adjacent edges of the body region and the source region. Therefore, a channel length of the super-junction device corresponds to a sidewall thickness. The sidewall thickness may be controlled to be a predetermined value in different batches. Thus, the channel length of the super-junction device may has a predetermined value, even in a case the super-junction device has a planar gate, which reduces process fluctuation in different batches and improves reliability of the super-junction device.

Figure 3:
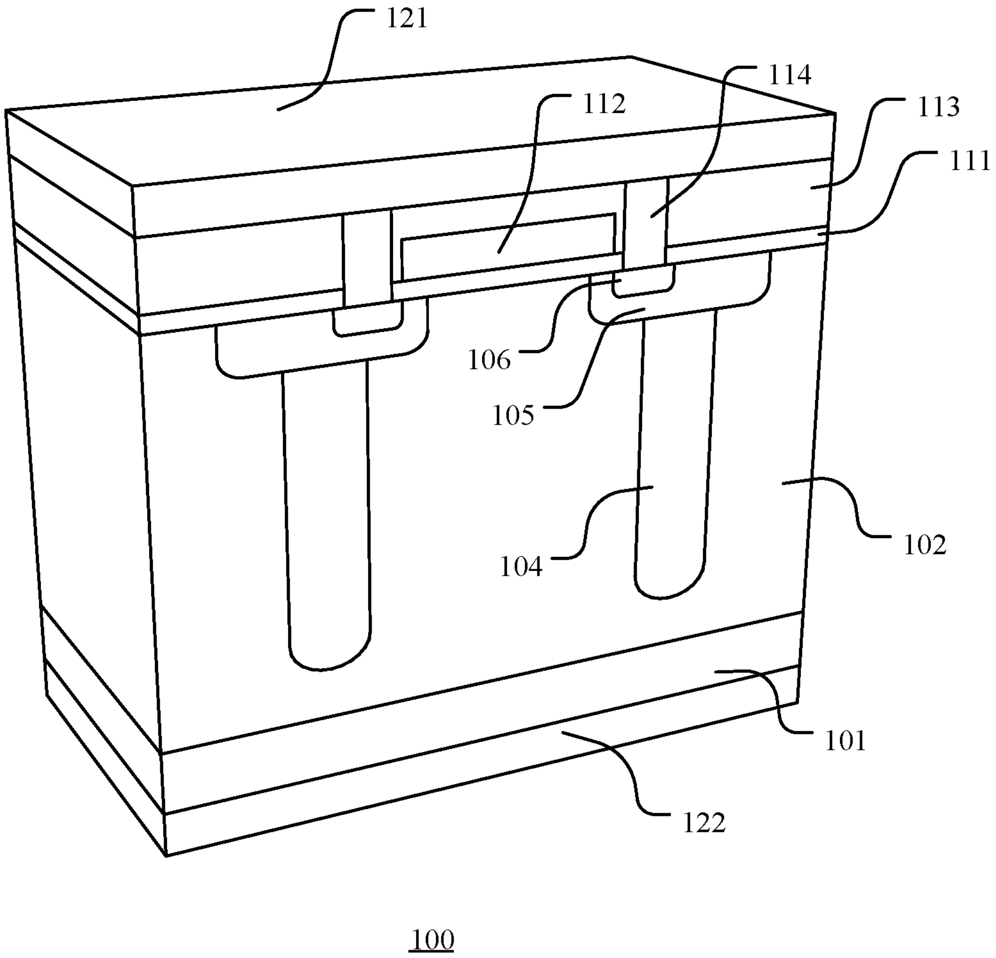
FIG. 3 shows a three-dimensional structural diagram of a super-junction device according to an embodiment of the present disclosure.

FIG. 3 shows a three-dimensional structural diagram of a super-junction device according to an embodiment of the present disclosure.

The super-junction device 100 includes an epitaxial layer 102 over a semiconductor substrate 101, and a first plurality of semiconductor pillars 104 in the epitaxial layer 102. The semiconductor substrate 101 and the epitaxial layer 102 are for example of an N type and the first plurality of semiconductor pillars 104 are for example of a P type. A portion of the epitaxial layer 102 between adjacent ones of the first plurality of semiconductor pillars 104 forms a second plurality of semiconductor pillars. The first plurality of semiconductor pillars and the second plurality of semiconductor pillars extend to substantially the same depth. Moreover, the first plurality of semiconductor pillars and the second plurality of semiconductor pillars are of opposite doping types and arranged in an alternate manner, so as to form a super-junction structure. Preferably, the first plurality of semiconductor pillars and the second plurality of semiconductor pillars have doping concentrations that are substantially identical ones along the plurality of trenches. A length of the first plurality of semiconductor pillars 104 is 60% to 90% of a thickness of the epitaxial layer 102. Preferably, a thickness of the epitaxial layer 102 is 10-100 microns and a length of the first plurality of semiconductor pillars 104 is 8-90 microns.

The body region 105 is located in the epitaxial layer 102, and the source region 106 is located in the body region. The body regions 105 and the first plurality of semiconductor pillars 104 are of the same dopant type, for example, a P type. The source region 106 and the semiconductor substrate 101 are of the same dopant type, for example, an N type. The first plurality of semiconductor pillars 104 extend below the body region 105. For example, the body region 103 overlaps with upper portions of the first plurality of semiconductor pillars 104.

The gate stack includes a gate dielectric 111 and a gate conductor 112. The gate stack is located above the epitaxial layer 102, wherein the gate stack extends across a first edge of the body region 105 and a first edge of the source region 106, such that a channel length of the super-junction device corresponds to a sidewall thickness of the sacrificial stack used in the manufacturing method.

Furthermore, an interlayer dielectric 113 is located above the epitaxial layer 102 and a conductive via 114 penetrates the interlayer dielectric 113. A source electrode 121 is located above the interlayer dielectric 113 and a drain electrode 122 is located on a surface of the semiconductor substrate 101 that is opposite to the epitaxial layer 102. The source electrode 121 is electrically coupled to the source region 106 via a conductive via 114.

The super-junction device according to the above embodiment, a gate stack extends across a first edge of the body region and a first edge of the source region. A channel length of the super-junction device corresponds to a sidewall thickness of the sacrificial stack in the manufacturing method. The sidewall thickness may be controlled to be a predetermined value in different batches. Thus, the channel length of the super-junction device may has a predetermined value, even in a case the super-junction device has a planar gate, which reduces process fluctuation in different batches and improves reliability of the super-junction device.

The super-junction device includes a super-junction structure formed in an epitaxial layer. The super-junction structure includes a first plurality of semiconductor pillars and second plurality of semiconductor pillars, which are of opposite doping types and arranged in an alternate manner.

The first plurality of semiconductor pillars have an auxiliary depletion effect on the second plurality of semiconductor pillars. Thus, the epitaxial region may have a higher doping concentration for the same withstand voltage state, thereby reducing the specific on-resistance of the super-junction device. Moreover, PN junctions in the super-junction structure have an effect of adjusting electric field distribution to be uniform one, thus improving the withstand voltage of the super-junction device.

In the above-described embodiment, a manufacturing method of the super-junction device is described with an N-type VDMOS device as an example. However, the present disclosure is not limited thereto. The doping types of various regions of the N-type VDMOS device may be reversal for a P-type VDMOS devices. In the above-described embodiment, a first plurality of semiconductor pillars are described as being formed by the steps of forming trenches in and epitaxial layer and epitaxially growing semiconductor layers in the trenches. In an alternative embodiment, the first plurality of semiconductor pillars may be formed directly in the epitaxial layer by ion implantation through a photoresist, similar to the body region. With a specific design of a pattern of the photoresist, the body region and the first plurality of semiconductor pillars may be formed in desired regions. The body region and the first plurality of semiconductor pillars may have implantation depths which are well controlled by adjusting ion implantation parameters, so that the first plurality of semiconductor pillars are located below the body region.

Unless specifically noted above, various layers or regions of the semiconductor device may be made of those materials well known to those skilled in the art. Semiconductor materials include, for example, Group III-V semiconductors such as GaAs, InP, GaN, and Group IV semiconductors such as Si, Ge. The source electrode, the drain electrode and the gate electrode and the gate conductive material may be formed of various conductive materials, such as a metal layer, a doped polysilicon layer, or a laminated conductor comprising the metal layer and the doped polysilicon layer, or other conductive materials, such as TaC, TiN, TaSiN, HfSiN, TiSiN, TiCN, TaAlC, TiAlN, TaN, PtSix, Ni3Si, Pt, Ru, W, and combinations of the various conductive materials. In this disclosure, the term "semiconductor structure" refers to a generic designation of the entire semiconductor structure formed in the various steps of fabricating a semiconductor device, including all layers or regions that have been formed.

The embodiments according to the present disclosure are described above, but the embodiments do not exhaust all the details and do not limit the invention to only the specific embodiments described. Obviously, according to the above description, many modifications and changes can be made. These embodiments are selected and specifically described in this specification in order to better explain the principles and practical disclosures of the present disclosure, thereby enabling those skilled in the art to make good use of the present disclosure and modifications based on the present disclosure. The present disclosure is limited only by the claims and their full scope and equivalents.

What is claimed is:

1. A method for manufacturing a super-junction device, comprising:
- forming an epitaxial layer above a semiconductor substrate;
- forming a first plurality of semiconductor pillars in the epitaxial layer;
- forming a sacrificial stack above the epitaxial layer;
- forming a body region in the epitaxial layer with the sacrificial stack as a first hard mask, the body region having a first edge aligned with the first hard mask and a second edge aligned with a first photoresist which is in direct contact with an upper surface of the epitaxial layer;
- forming a sidewall on a side surface of the sacrificial stack;
- forming a source region in the body region with the sacrificial stack and the sidewall as a second hard mask, the source region having a first edge aligned with the second hard mask;
- removing the sacrificial stack; and
- forming a gate stack on the epitaxial layer,
- wherein the gate stack extends across the first edge of the body region and the first edge of the source region such that a channel length of the super-junction device corresponds to a sidewall thickness of the sacrificial stack,
- wherein the first photoresist is completely removed before removing the sacrificial stack.

2. The manufacturing method according to claim 1, wherein the step of forming the first plurality of semiconductor pillars comprises:
- forming a plurality of trenches in the epitaxial layer; and
- epitaxially growing semiconductor layers in the plurality of trenches, respectively.

3. The manufacturing method according to claim 1, wherein the step of forming a first plurality of semiconductor pillars comprises: forming a plurality of doped regions in the epitaxial layer.

4. The manufacturing method according to claim 1, wherein a length of the first plurality of semiconductor pillars is 60% to 90% of a thickness of the epitaxial layer.

5. The manufacturing method according to claim 4, wherein the thickness of the epitaxial layer is 10-100 microns and the length of the first plurality of semiconductor pillars is 8-90 microns.

6. The manufacturing method according to claim 1, wherein the step of forming the body region comprises: forming a first photoresist on the epitaxial layer, and implanting ions through an opening between the first hard mask and the first photoresist such that the body region has the first edge aligned with the first hard mask and the second edge aligned with the first photoresist.

7. The manufacturing method according to claim 1, wherein the step of forming the source region comprises: forming a second photoresist on the epitaxial layer, and implanting ions through an opening between the second hard mask and the second photoresist such that the source region has a first edge aligned with the second hard mask and a second edge aligned with the second photoresist.

8. The manufacturing method according to claim 1, after the step of forming the gate stack, further comprising:
- forming an interlayer dielectric on the epitaxial layer;
- forming a conductive via through the interlayer dielectric;
- forming a source electrode above the interlayer dielectric; and
- forming a drain electrode above a surface of the semiconductor substrate that is opposite to the epitaxial layer,
- wherein the source electrode is electrically coupled to the source region through the conductive via.

9. The manufacturing method according to claim 8, before forming the drain electrode, further comprising: thinning a surface of the semiconductor substrate that is opposite to the epitaxial layer.

10. The manufacturing method according to claim 1, wherein the body region overlaps with an upper portion of at least one of the first plurality of semiconductor pillars.

11. The manufacturing method according to claim 1, wherein each of the semiconductor substrate, the epitaxial layer and the source region is of a first doping type, and each of the first plurality of semiconductor pillars and the body region is of a second doping type.

12. The manufacturing method according to claim 11, wherein the first doping type is one of an N type and a P type, and the second doping type is the other of the N type and the P type.

13. A super-junction device formed by the manufacturing method according to claim 1, comprising:

the epitaxial layer above the semiconductor substrate;

the first plurality of semiconductor pillars in the epitaxial layer;

the body region in the epitaxial layer, at least one of the first plurality of semiconductor pillars extending below the body region;

the source region in the body region; and the gate stack above the epitaxial layer, wherein the gate stack extends across the first edge of the body region and the first edge of the source region such that the channel length of the super-junction device corresponds to the sidewall thickness of the sacrificial stack.

14. The super-junction device according to claim 13, wherein a length of the first plurality of semiconductor pillars is 60% to 90% of a thickness of the epitaxial layer.

15. The super-junction device according to claim 14, wherein the thickness of the epitaxial layer is 10-100 microns and the length of the first plurality of semiconductor pillars is 8-90 microns.

16. The super-junction device according to claim 13, further comprising:

an interlayer dielectric above the epitaxial layer;

a conductive via through the interlayer dielectric;

a source electrode above the interlayer dielectric; and a drain electrode above a surface of the semiconductor substrate that is opposite to the epitaxial layer, wherein the source electrode is electrically coupled to the source region through the conductive via.

17. The super-junction device according to claim 13, wherein the body region overlaps with an upper portion of at least one of the first plurality of semiconductor pillars.

18. The super-junction device according to claim 13, wherein each of the semiconductor substrate, the epitaxial layer and the source region is of a first doping type, and each of the first plurality of semiconductor pillars and the body region is of a second doping type.

19. The super-junction device according to claim 18, wherein the first doping type is one of an N type and a P type, and the second doping type is the other of the N type and the P type.

20. A method for manufacturing a super-junction device, comprising:

forming an epitaxial layer above a semiconductor substrate;

forming a first plurality of semiconductor pillars in the epitaxial layer;

forming a sacrificial stack above the epitaxial layer;

forming a body region in the epitaxial layer with the sacrificial stack as a first hard mask, the body region having a first edge aligned with the first hard mask;

forming a sidewall on a side surface of the sacrificial stack;

forming a source region in the body region with the sacrificial stack and the sidewall as a second hard mask, the source region having a first edge aligned with the second hard mask;

removing the sacrificial stack; and forming a gate stack on the epitaxial layer, wherein the gate stack extends across the first edge of the body region and the first edge of the source region such that a channel length of the super-junction device corresponds to a sidewall thickness of the sacrificial stack, wherein at least one of the first plurality of semiconductor pillars extends to a depth level below a bottom surface of the body region.

* * * * *